(12) United States Patent
Kneissl et al.

(10) Patent No.: US 9,705,030 B2
(45) Date of Patent: Jul. 11, 2017

(54) UV LED WITH TUNNEL-INJECTION LAYER

(71) Applicants: Technische Universitaet Berlin, Berlin (DE); Forschungsverbund e.V., Berlin (DE)

(72) Inventors: Michael Kneissl, Berlin (DE); Tim Kolbe, Berlin (DE)

(73) Assignees: Technische Universität Berlin, Berlin (DE); Forschungsverbund e.V., Berlin (DE)

(*) Notice: Subject to any disclaimer, the term of this patent is extended or adjusted under 35 U.S.C. 154(b) by 0 days.

(21) Appl. No.: 13/865,325

(22) Filed: Apr. 18, 2013

(65) Prior Publication Data
US 2013/0277642 A1    Oct. 24, 2013

Related U.S. Application Data

(60) Provisional application No. 61/625,934, filed on Apr. 18, 2012.

(51) Int. Cl.
*H01L 29/06* (2006.01)
*H01L 33/06* (2010.01)
*H01L 33/32* (2010.01)

(52) U.S. Cl.
CPC .............. *H01L 33/06* (2013.01); *H01L 33/32* (2013.01)

(58) Field of Classification Search
CPC ....... H01L 33/32; H01L 33/06; H01L 33/007; H01L 33/04; H01L 33/14; H01L 33/145; H01L 33/0075; H01L 21/02458; H01L 21/0254; H01L 21/02505; H01L 21/02507; H01L 27/15; H01L 29/2003; H01S 5/34333; H01S 5/32341; H01S 5/3216; H01S 5/2009; H01S 5/3211; H01S 5/3407; H01S 5/343
USPC ............. 257/79, 103, 94, E33.008, E33.027, 257/E33.068, 13, 200, 201, 97; 438/22, 438/47, 48
See application file for complete search history.

(56) References Cited

U.S. PATENT DOCUMENTS

| | | | |
|---|---|---|---|
| 6,664,560 B2 * | 12/2003 | Emerson | ............... H01L 33/007 257/103 |
| 6,943,377 B2 | 9/2005 | Gaska et al. | |
| 7,812,366 B1 | 10/2010 | Sampath et al. | |
| 7,848,379 B2 | 12/2010 | Shur et al. | |

(Continued)

OTHER PUBLICATIONS

Sumiya et al., "AlGaN-Based Deep Ultraviolet Light-Emitting Diodes Grown on Epitaxial AlN/Sapphire Templates", Japanese Journal of Applied Physics, vol. 47, No. 1, pp. 43-46, 2008.

(Continued)

*Primary Examiner* — Cory Eskridge
(74) *Attorney, Agent, or Firm* — Rothwell, Figg, Ernst & Manbeck, P.C.

(57) ABSTRACT

An ultraviolet (UV) light emitting structure, a UV light emitting device, and a method of making a UV light emitting structure or device, wherein the UV light emitting structure or device has an AlN or AlGaN injection layer with high aluminum content between the light emitting active region and the p-doped layers and wherein the injection layer has a thickness such that holes can tunnel from the p-side of the semiconductor-based ultraviolet light emitting diode structure through the injection layer in the active zone and also reducing leakage electrons out of the active zone.

28 Claims, 6 Drawing Sheets a) without Al(Ga)N tunnel injector b) with tunnel injector c) with tunnel injector and electron blocking layer (EBL)

(56) References Cited

U.S. PATENT DOCUMENTS

| | | | |
|---|---|---|---|
| 7,977,687 B2 | 7/2011 | Chang et al. | |
| 2007/0096077 A1* | 5/2007 | Sanga | H01L 29/205 257/13 |
| 2009/0283028 A1* | 11/2009 | Schowalter | H01L 21/02389 117/9 |
| 2010/0032647 A1 | 2/2010 | Khan et al. | |
| 2010/0219395 A1* | 9/2010 | Hirayama et al. | 257/13 |
| 2011/0103421 A1* | 5/2011 | Sharma | B82Y 20/00 372/45.012 |
| 2011/0187294 A1* | 8/2011 | Bergmann | H01L 33/04 315/363 |

OTHER PUBLICATIONS

Zhang et al., "Suppression of the subband parasitic peak by 1 nm i-AlN interlayer in AlGaN deep ultraviolet light-emitting diodes", Applied Physics Letters, 93, pp. 131117-131117-3, 2008.

\* cited by examiner

UV LED WITH TUNNEL-INJECTION LAYER

FIELD OF THE INVENTION

The present invention is an ultraviolet (UV) light emitting structure having a tunnel-injection layer, a UV light emitting device, and a method of making a UV light emitting structure or device.

BACKGROUND OF THE INVENTION

Most existing UV light emitting diodes (LEDs) use an electron blocking layer (EBL), which is a ~15-20 nm, p-doped Mg:AlGaN layer intended to improve hole injection in the active layer as well as to reduce electron leakage current from the active layer. EBLs function quite well for wavelengths >300 nm, but their effectiveness is drastically reduced at shorter wavelengths. This is because at wavelengths <280 nm the barrier layer must carry a high concentration of Al (between 60 and 100%) and the ionization energy of the Mg acceptors is very high. This makes effective p-doping for these wavelengths practically impossible. Therefore the carrier injection is very low and there is the additional problem of unwanted parasitic luminescence. In addition both the internal and external quantum efficiency of LEDs at these wavelengths are extremely low (between 222-240 nm a fraction of a percent and from 250-280 nm. around one percent) and the performance is extremely low. One LED exists at 210 nm with an output power of only 20 nW (Yoshitaka Taniyasu et al., Nature Vol 441, 325ff (2006)).

So far UV LEDs have only been made with conventional p-doped AlGaN EBLs. For deep UV wavelengths this requires high Al concentrations for the EBL whose p-doping is difficult due to the high ionization energy of the magnesium acceptors. Therefore the carrier injection into the active region very poor, leading to poor internal and external quantum efficiencies and, therefore, poor overall performance. The shorter the LED wavelength, the higher the band-gap energy, in turn determining the aluminum content of the AlGaN:Mg EBL layers. Especially for UV-C LEDs (emission from 200 to 280 nm) AlGaN:Mg EBL layers with very high aluminum content are required (typically between 60% and 100%). Due to the high ionization energy of the Mg acceptors (over 500 meV for AlN) the p-doping of AlGaN is very difficult or perhaps impossible (see for example Nam et al., Appl. Phys. Lett. 83, 878 (2003), which is incorporated herein by reference in its entirety). The effectiveness of the AlGaN:Mg EBL at high aluminum content is thereby strongly limited and this approach for UV-C LEDs is completely unusable.

The suppression of parasitic or ancillary luminescence, with the use of an AlN intermediate layer is described in Sumiya et al., "AlGaN-Based Deep Ultraviolet Light-Emitting Diodes Grown on Epitaxial AlN/Sapphire Templates" Japanese Journal of Applied Physics, 2008, 47(1), 43-46 and Zhang et al., "Suppression of the subband parasitic peak by 1 nm i-AlN interlayer in AlGaN deep ultraviolet light-emitting diodes," Applied Physics Letters, 2008, 93 (13117-1-3), which are incorporated herein by reference in their entireties. A 1 nm AlN layer was used to remedy the negative effects of the still-present EBL and the wavelengths therefore remained above 260 nm.

In view of the above, it is an object of the present invention to use new layering for increasing the quantum efficiency of LEDs in the deep UV (DUV) region, thereby increasing the overall performance and reducing parasitic luminescence.

It is also an object of the present invention to improve hole injection while reducing electron leakage current without the doping problems that arise when trying to achieve shorter wavelengths.

SUMMARY OF THE INVENTION

In a first aspect, the invention provides a UV LED structure having a thin injection layer of doped or undoped AlN or AlGaN between the active zone and the p-side of a UV LED, with or without EBL. According to this structure, the carrier injection in the active zone is significantly improved so that the internal and external quantum efficiency can be improved by at least a factor of three over a 228 nm LED with standard EBL. Additionally, it has been found that the injection layer inhibits electron leakage current from the active zone into the p-doped area of the LED. It has further been found that the injection layer according to the invention greatly reduces ancillary luminescence.

The thickness of the injection layer is a critical feature of the invention. It must be thin enough to allow hole tunneling to the active layer, but also thick enough to block the electron leakage current.

In a second aspect, the invention provides a device comprising the UV LED structure of the first aspect.

In a third aspect, the invention provides a method of manufacturing of the first embodiment above, wherein the layer of doped or undoped AlN or AlGaN is deposited between the active zone and the p-side of a UV LED, with or without EBL.

In a fourth aspect, the invention provides a method of manufacturing a device comprising the first aspect above, wherein the UV LED structure of the first aspect is incorporated into a semiconductor device.

BRIEF DESCRIPTION OF THE DRAWINGS

FIG. 1a) light emitter structures without the Al(Ga)N-injection layer. FIG. 1b) light emitter structures with Al(Ga)N injection layer between the active zone and the p-doped region. FIG. 1c) light emitter structures with Al(Ga)N injection layer between the active zone and the EBL.

FIG. 3a) IQE as a function of current density. FIG. 3b) internal IEQ at 200 A/$cm^2$ as a function of AlN injector layer thickness. The simulation is based on a 1-dimensional drift-diffusion model which considers quantum mechanical effects such as thermally assisted tunneling of charge carriers.

FIG. 4a) internal IQE as a function of current density. FIG. 4b) internal IEQ at 200 A/cm² as a function of AlGaN injection layer thickness. The simulation is based on a 1-dimensional drift-diffusion model which considers quantum mechanical effects such as thermally assisted tunneling of charge carriers.

DETAILED DESCRIPTION OF THE INVENTION

Figure 1:
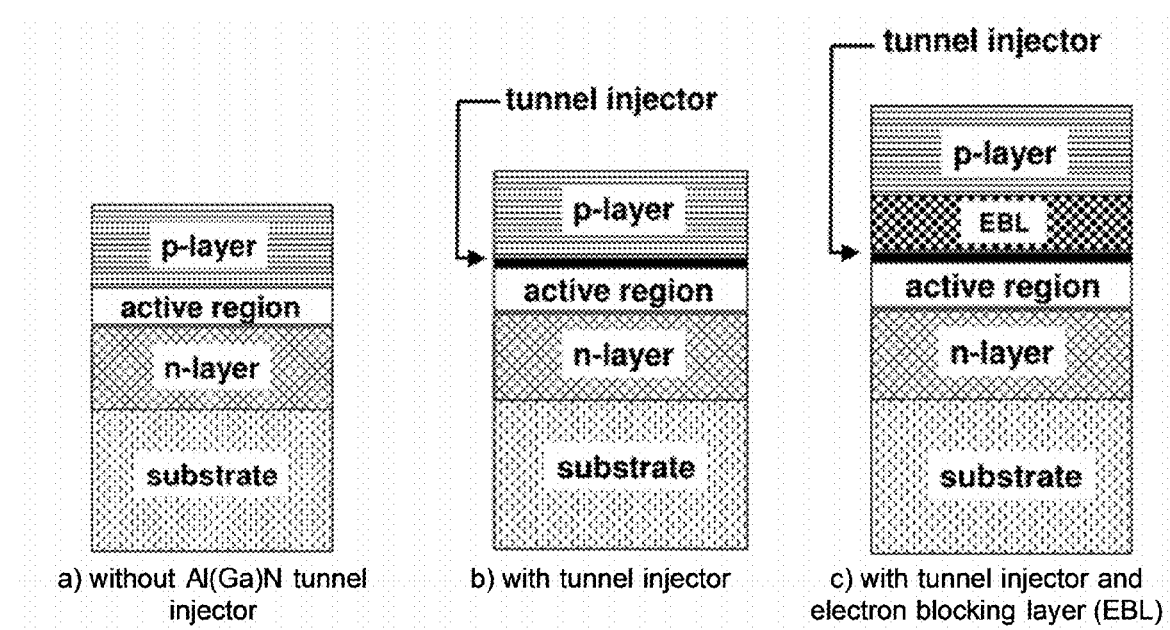
FIG. 1: Schematic illustration of light emitter structures.

The invention provides a semiconductor-based ultraviolet (UV) light emitting diode structure having a thin doped or undoped AlN or AlGaN injection layer (with high Aluminum content) between the light emitting active zone and the p-doped layers of a UV LED. In one embodiment, the AlN or AlGaN injection layer is unintentionally doped. In another embodiment, the AlN or AlGaN injection layer is n-doped, e.g., doped with Si, Ge, or O. In preferred embodiments, the AlN or AlGaN injection layer should not be Mg-doped. The inventors have found that the hole injection into the active zone is unexpectedly improved by using the inventive injection layer in semiconductor-based ultraviolet (UV) light emitting diode devices, which greatly improves the external quantum efficiency (EQE) and internal quantum efficiency (IQE). Light emitting heterostructures and LEDs and methods of making such devices and structures are described in U.S. 2010/0032647; U.S. Pat. Nos. 7,977,687; 7,848,379; 7,812,366; 6,943,377; which are incorporated by reference in theft entireties.

Numerical simulations indicate that the IQE of a UV LED can be more than tripled with the new design. Additionally, the injection layer inhibits electron current in the p-doped layers of the LED, leading to a further improvement of the quantum efficiencies and to a clear reduction in parasitic luminescence (caused by carrier recombination outside the active zone, especially in the p-doped area). Commercially produced UV light emitters have until now been made with a conventional p-doped AlGaN:Mg EBL between the active and p-doped layers (see for example Hirayama et al., Appl. Phys. Lett. 91, 071901 (2007), which is incorporated herein by reference in its entirety).

In one embodiment, the invention includes an AlGaN:Mg EBL that both improves hole injection and serves barrier to electrons, thereby reducing leakage current from the active zone.

The invention includes a new approach for hole injection into the active zone of UV LEDs that does not require a p-doped AlGaN:Mg EBL. The basic idea is to make hole injection into the active zone possible by means of tunnel injection through an unintentionally doped or undoped, very thin AlN or AlGaN injection layer. The thickness of this AlN or AlGaN injection layer is critical. It must be thin enough to allow holes from the p-side of the LED to tunnel into the active zone but also thick enough and a high enough barrier to prevent electrons from leaking out of the active zone. Simulations of the LED heterostructure were made in order to study the function and effect of the AlN or AlGaN injection layer between the active zone and the p-side of the light emitter. The simulations are based on a one-dimensional drift-diffusion model which accounts for quantum mechanical effects such as charge carrier tunneling (commercial SW package SiLENSe from STR). LEDs were simulated with doped and undoped AlN or AlGaN injection layers of varying thickness which emit at 228 nm. Additionally, AlGaN injection layers with a gradient in aluminum concentration (from 100% down to 80%) were simulated. In comparison, 228 nm emitting LEDs without this injection layer and 228 nm emitting LEDs with a conventional 20 nm thick $Al_{0.95}Ga_{0.05}N$ EBL were also simulated. Additionally, the influence of a graded superlattice on the carrier injection for 228 nm LEDs with 3 nm AlN injector layer was simulated.

In certain embodiments, the wavelength used for initial models and devices is 228 nm because of the prevalence of interesting transitions at the wavelength for oxygen, nitrous oxide, proteins and other molecules of interest with applications for example in explosives and bioagent detection, among many others. Other deep UV wavelengths may be favored depending on the application. Application techniques of deep UV light sources range over curing, lithography, treatment (sterilization, disinfection, pasteurization) and medical applications to spectroscopy (e.g. absorption, resonance raman, induced fluorescence) and many other techniques.

The basic structure for simulated LEDs are as follows:

| | |
|---|---|
| a) | 20 nm p-GaN Contact layer, [Mg] = 2 * $10^{19}$ $cm^{-3}$ |
| b) | 20 nm (5 × 2 nm/2 nm) p-$Al_{0.6}GaN$/p-$Al_{0.4}GaN$ superlattice, [Mg] = 2 * $10^{19}$ $cm^{-3}$ |
| c) | X nm Al(Ga)N-Injection layer |
| d) | 5 nm $Al_{0.92}GaN$ Quantum barrier |
| e) | 2.3 nm $Al_{0.8}GaN$ Quantum well layer (UV light-emitting layer) |
| f) | 5 nm $Al_{0.92}GaN$ Quantum barrier |
| g) | 1000 nm n-$Al_{0.92}GaN$ current spreading layer |
| h) | 1000 nm AlN base layer |
| i) | substrate | where X is either between 1 nm and 5 nm. In certain embodiments, where [Al]-gradients are used, X is preferably between about 3 nm and about 8 nm. The active region of the LED is comprised of one or several $Al_{0.8}GaN$ quantum well layer (e) that are sandwiched between $Al_{0.92}GaN$ quantum barrier layers (d and f). The thickness of the quantum well layer (e) ranges typically between 0.5 nm and about 20 nm and the thickness of the quantum barrier (d and f) ranges typically between 0.5 nm and about 50 nm. The first and last quantum barrier (d and f) can have the same or different thicknesses.

Figure 2:
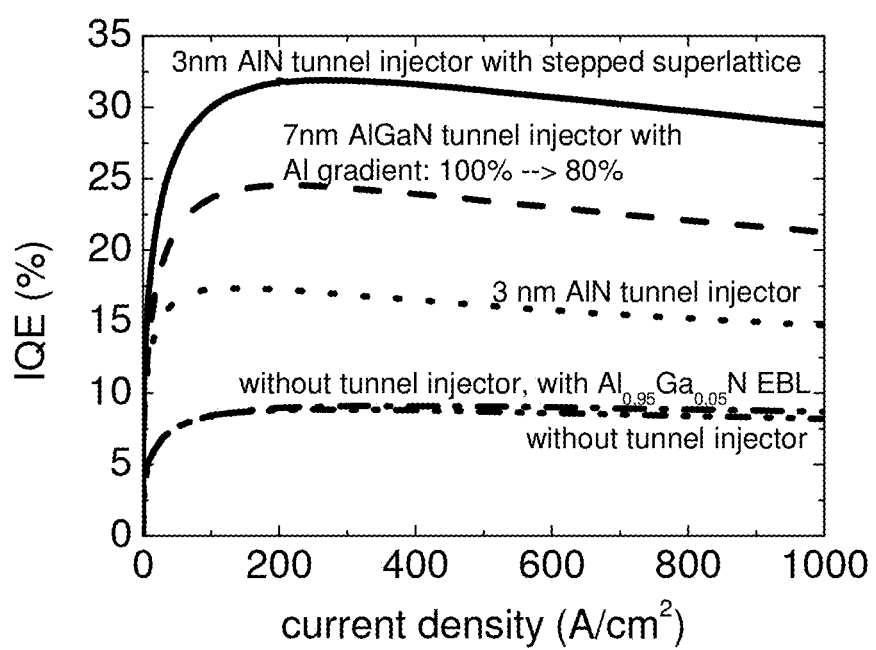
FIG. 2: Simulated internal IQE for 228 nm LEDs without AlN injection layer, with 3 nm AlN-injection layer between the active zone and the p-doped region, with 7 nm AlGaN injection layer between the active zone and the p-doped region with aluminum concentration gradient (over the 7 nm from 100% down to 80%), with a 3 nm AlN injection layer with stepped p-doped superlattice (3×2 nm p-$Al_{0.8}$GaN/$Al_{0.6}Ga_{0.4}$N and 3×2 nm p-$Al_{0.6}Ga_{0.4}$N/$Al_{0.4}Ga_{0.6}$N), and a LED with conventional 20 nm thick $Al_{0.95}Ga_{0.05}$N EBL.

FIG. 2 shows the simulated internal quantum efficiency for 228 nm LEDs without AlN injection layer and with a 3 nm as well as a 7 nm thick AlN injection layer (with a gradient in aluminum concentration over the 7 nm thick sample from 100% down to about 80%) between the active zone and the p-doped region and a 3 nm thick AlN injection layer with a stepwise p-doped superlattice (3×2 nm p-Al$_{0.8}$GaN/Al$_{0.6}$Ga$_{0.4}$N and 3×2 nm p-Al$_{0.6}$Ga$_{0.4}$N/Al$_{0.4}$Ga$_{0.6}$N), as well as a conventional 20 nm. thick Al$_{0.95}$Ga$_{0.05}$N EBL functioning as a current concentrator. It is clear that the LEDs without an AlN injection layer and without p-doped Al$_{0.95}$Ga$_{0.05}$N:Mg EBL reach only 8.7% maximum internal quantum efficiency, IQE, in the simulation. Even conventional LEDs with 20 nm thick p-doped Al$_{0.95}$Ga$_{0.05}$N:Mg EBL reached only 9.1% IQE in the simulation. In contrast the new design presented here with a 3 nm thick AlN injection layer between the active zone and the p-side results in a significant increase in simulated IQE to 17.4%. A further clear increase in simulated IQE up to 24.6% was achieved by using a gradual reduction of aluminum concentration in the AlGaN injection layer from 100% on the side facing the active zone down to 80% on the side facing the p-region. Even further increases were only possible through the use of a stepped superlattice above the 3 nm thick AlN injection layer, thereby improving hole injection into the active zone. For this LED structure the maximum IQE simulated is 31.9%.

Figure 3:
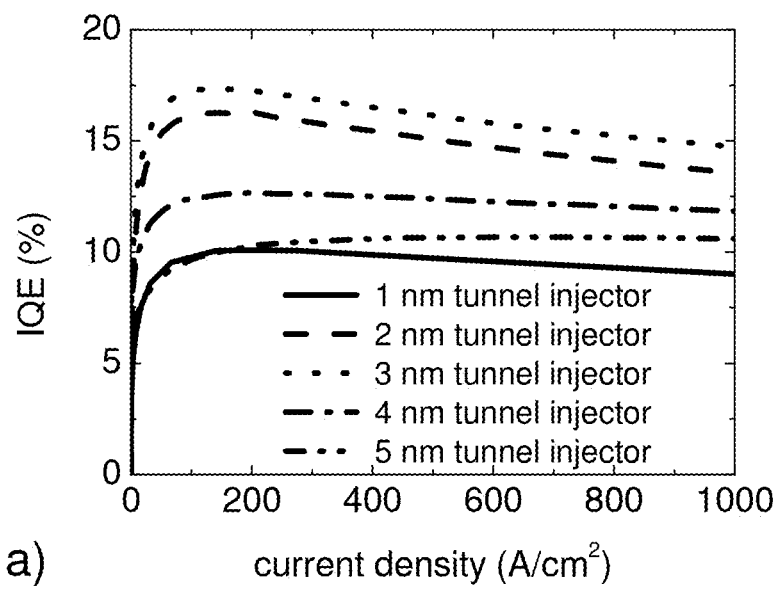
FIG. 3: Simulated IQE for 228 nm LEDs with AlN injection layers of varying thickness between the active zone and the p-doped region.
Figure 3:
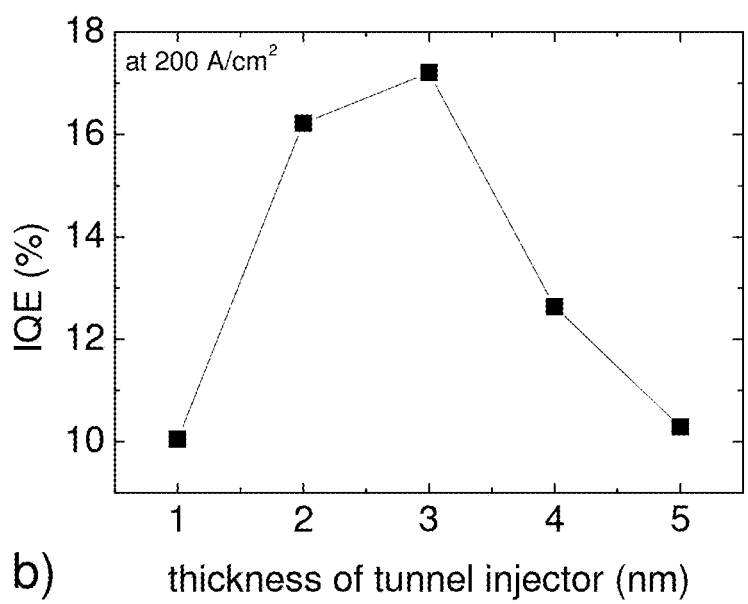

FIG. 3 shows the simulated IQE for 228 nm LEDs with AlN injection layers of variable thickness between the active zone and the p-doped region. It can be concluded that the maximum IQE is obtained for LEDs with a 3 nm thick AlN injection layer.

Figure 4:
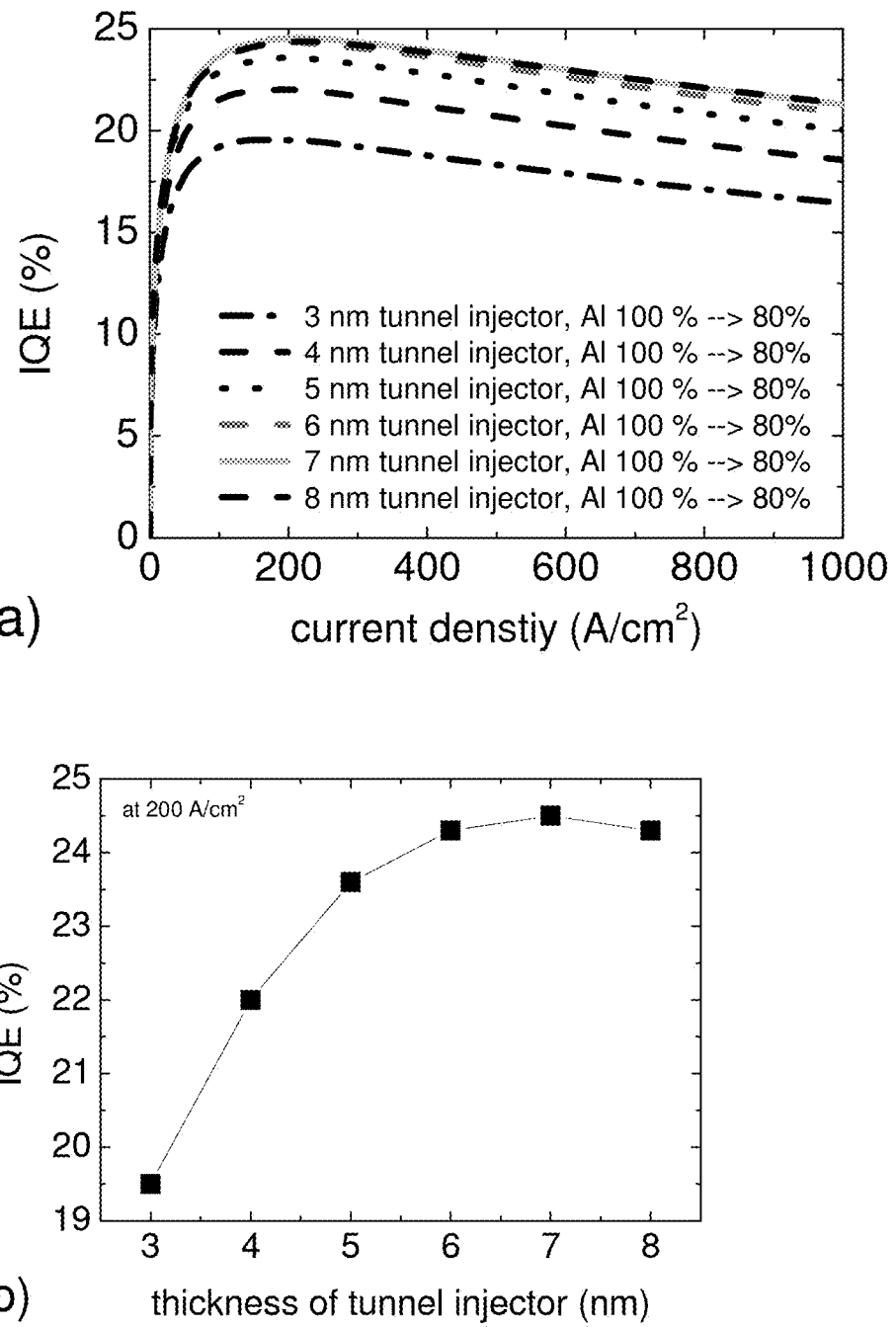
FIG. 4: Simulated IQE for 228 nm LEDs with AlN injection layers between the active zone and the p-doped region with steadily varying aluminum concentration (from 100% to 80%).

FIG. 4 shows the simulated IQE for 228 nm LEDs with AlGaN injection layers with a gradient in aluminum concentration between the active zone and the p-doped area from 100% down to 80%. The maximum IQE is reached for an LED with a 7 nm thick AlGaN injection layer (of steadily varying aluminum concentration).

Figure 5:
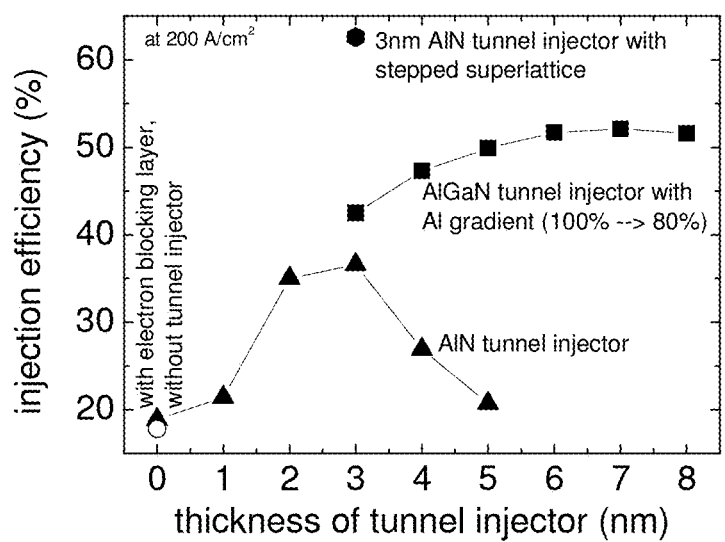
FIG. 5: Simulated injection efficiency at 200 A/cm² for 228 nm LEDs with Al(Ga)N injection layers between the active zone and the p-region of varying thickness. The injection efficiency of a 228 nm LED with conventional 20 nm thick p-$Al_{0.95}Ga_{0.05}N$ EBL is also shown. The simulation is based on a 1-dimensional drift-diffusion model which considers quantum mechanical effects such as thermally assisted tunneling of charge carriers.

FIG. 5 shows the simulated injection efficiency of 200 A/cm$^2$ for 228 nm LEDs with Al(Ga)N injection layers of varying thickness between the active zone and the p-doped region. Shown are LEDs without injection layers, LEDs with AlN injection layers of varying thickness, LEDs with AlGaN injection layers of varying aluminum concentration, LEDs with 3 nm thick AlN injection layer with stepped superlattice (3×2 nm p-Al$_{0.8}$GaN/Al$_{0.6}$Ga$_{0.4}$N u. 3×2 nm p-Al$_{0.6}$Ga$_{0.4}$N/Al$_{0.4}$Ga$_{0.6}$N), and LEDs with conventional 20 nm thick Al$_{0.95}$Ga$_{0.05}$N:Mg EBL. FIG. 5 demonstrates that the 62% injection efficiency of the new LED design with AlN injection layer is more than 3.3 times better than that for a 228 nm LED with standard EBL.

Figure 6:
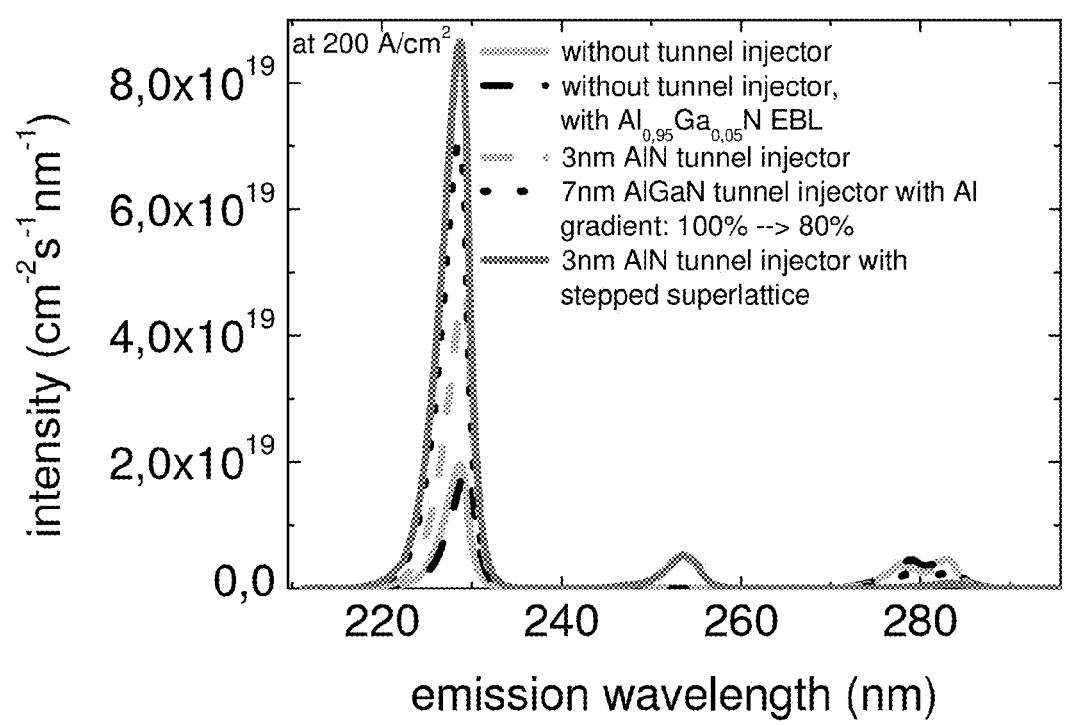
FIG. 6: Simulated emission spectrum for 228 nm LEDs without AlN injection layer, with a 3 nm AlN injection layer between the active zone and the p-region, with a 7 nm AlGaN injection layer between the active zone and the p-region with steadily varying aluminum concentration (Gradient over the 7 nm from 100% to 80%), with a 3 nm AlN injection layer with a stepped p-doped superlattice (3×2 nm p-$Al_{0.8}GaN/Al_{0.6}Ga_{0.4}N$ and 3×2 nm p-$Al_{0.6}Ga_{0.4}N/Al_{0.4}Ga_{0.6}N$), and a LED with conventional 20 nm thick $Al_{0.95}Ga_{0.05}N$ EBL.

FIG. 6 shows the simulated emission spectrum at 200 A/cm$^2$ for the 228 nm LEDs without injection layer, with 3 nm AlN injection layer, with a 7 nm AlGaN injection layer with graded aluminum concentration (from 100% down to about 80%), with a 3 nm AlN injection layer with stepped p-doped superlattice (3×2 nm p-Al$_{0.8}$GaN/Al$_{0.6}$Ga$_{0.4}$N and 3×2 nm p-Al$_{0.6}$Ga$_{0.4}$N/Al$_{0.4}$Ga$_{0.6}$N), and with a conventional 20 nm thick Al$_{0.95}$Ga$_{0.05}$N EBL. There is a clear increase in quantum film luminescence at 228 nm and a clear decrease of the longer wave parasitic luminescence for LEDs with an AlN injection layer. Besides the use of an undoped AlN intermediate layer without conventional EBL (FIG. 1b), it is also possible to use this injection layer with an EBL (FIG. 1c). Additionally, an AlGaN injection layer optimally doped with Al to reach a wavelength of 228 nm may be used instead of an AlN injection layer. These layers may be either doped or undoped. Also, the effectiveness of an injection layer can be shown at different thicknesses, so that use of this layer at thicknesses from 1 nm to 8 nm is easily realized.

In certain embodiments, additional increases in charge carrier injection can be achieved by using gradients in the composition of the injection layer, for example in a 7 nm thick Al$_x$Ga$_{1-x}$N injection layer varying the aluminum concentration from about 100% at the side facing the active zone down to about 80% at the side facing the p-region. A further increase in hole injection can be obtained by using p-layers with varying aluminum concentration.

In one embodiment, a stepped p-doped superlattice (3×2 nm p-Al$_{0.8}$GaN/Al$_{0.6}$Ga$_{0.4}$N and 3×2 nm p-Al$_{0.6}$Ga$_{0.4}$N/Al$_{0.4}$Ga$_{0.6}$N) can be used to achieve a large increase in the IQE.

As used herein, the term "stepped" refers to a step-like change in average aluminum mole fraction between the different p-doped superlattices. For example, the structure can include the following layers above the substrate sequentially from the substrate: an active region, a 3 nm undoped (or unintentionally doped) AlN tunnel injector, 3 periods of a 2 nm p-Al$_{0.8}$GaN/2 nm p-Al$_{0.6}$Ga$_{0.4}$N (average aluminum mole fraction=70%) superlattice, a 3 periods of a 2 nm p-Al$_{0.6}$Ga$_{0.4}$N/2 nm p-Al$_{0.4}$Ga$_{0.6}$N (average aluminum mole fraction=50%) superlattice, and a p-GaN contact layer (average aluminum mole fraction=0%).

In another embodiment, a gradual or continuous variation of the aluminum mole fraction may be used in the p-doped superlattice.

In one embodiment, the p-doping is nominally the same in all of the p-doped layers. In another embodiment, the p-doping is varied. Typical Mg-doping concentrations in the p-doped layers range between [Mg]=5*10$^{18}$ cm$^{-3}$ and [Mg]=2*10$^{20}$ cm$^{-3}$. Typically the Mg-doping concentration in the p-doped GaN layers is higher, e.g. [Mg]=1*10$^{20}$ cm$^{-3}$, whereas the Mg-doping concentration in the p-doped AlGaN layers is in the range of [Mg]=2*10$^{19}$ cm$^{-3}$. It is also possible that the Mg-doped AlGaN layer closest to the AlN injection layer has a higher Mg concentration to facilitate tunnel injection of holes, e.g. [Mg]=5*10$^{19}$ cm$^{-3}$.

Those skilled in the art will recognize that there is slight variation in Mg-doping because magnesium incorporation changes with the aluminum mole fraction in the layers. In certain embodiments, it is possible to compensate for this variation by changing the gas phase composition in a metalorganic vapour phase epitaxy (MOVPE) reactor.

As used herein, the term "unintentionally doped" refers to embodiments where no doping is intended in the layer, e.g., in the AlN tunnel injector, but an amount of one or impurities is unintentionally incorporated during growth, e.g., due to the contamination of the sources. In the case of group III-nitrides, almost all impurities are shallow donors (Si, O). Oxygen can be also a localized deep state (DX) center in AlGaN.

In one embodiment, the invention comprises a semiconductor-based ultraviolet light emitting diode structure comprising a light emitting active region, one or more p-doped layers, an AlN or AlGaN injection layer with high aluminum content between the light emitting active region and the p-doped layer. In preferred embodiments, the injection layer has a thickness and aluminum mole fraction such that holes can tunnel from the p-side of the semiconductor-based ultraviolet light emitting diode structure through the injection layer in the active zone and also reducing leakage electrons out of the active zone.

In embodiment, the aluminum content of the AlN or AlGaN tunnel injector layer is higher than aluminum mole fraction in each of the one or more p-doped layers. In embodiment, the light emitting active region comprises one or more AlGaN or InAlGaN quantum well layers that are sandwiched between AlGaN or InAlGaN quantum barrier layers. In one embodiment, the thickness of the quantum well layer ranges between about 0.5 nm and about 20 nm and the thickness of the quantum barrier ranges typically between about 0.5 nm and about 50 nm. The first and last quantum barrier can have the same or different thicknesses. In one embodiment, the aluminum content of the AlN or AlGaN tunnel injector layer is higher than the aluminum mole fraction of the quantum barriers. In certain embodiments, the AlGaN or InAlGaN quantum barriers have an indium and aluminium mole fraction such that the bandgap energy of the layer is larger than that of the AlGaN or InAlGaN quantum well layer and smaller than that of the AlN or AlGaN tunnel injector layer.

In embodiment, the light emitting active region comprises quantum barriers, and wherein the aluminum content of the AlN or AlGaN tunnel injector layer is higher than the aluminum mole fraction of the quantum barriers.

In embodiment, the light emitting active region comprises quantum barriers, wherein one or more of said p-doped layers comprise aluminum, and wherein the aluminum mole fraction of the p-doped layers is lower than aluminum mole fraction of the quantum barriers.

In embodiment, the light emitting active region comprises quantum barriers, wherein one or more of the p-doped layers comprise aluminum and the aluminum mole fraction of the p-doped layers is equal to or higher than aluminum mole fraction of the quantum barriers.

In embodiment, the thickness of the injection layer is between about 0.1 nm and about 12 nm, preferably about 1 nm to about 8 nm, more preferably about 3 nm to about 5 nm.

In embodiment, the thickness of the injection layer has Al concentration between about 60% and about 100%. When Al concentration is 100%, there is no Ga in the layer, i.e. the layer is AlN.

In embodiment, the active layer has a thickness of about 1 nm to about 1000 nm.

In embodiment, the one or more p-doped layer independently has a thickness of about 10 nm to about 1000 nm.

In embodiment, the active layer is doped with an impurity and wherein the doping is either intentional doping or unintentional doping.

In embodiment, the injection layer is doped with an impurity and wherein the doping is either intentional doping or unintentional doping.

In a preferred embodiment, the impurity is present in an amount less than $10^{18}$ cm$^{-3}$. For example, the injection layer may be intentionally or unintentionally doped with at least one impurity selected from the group consisting of silicon, oxygen, beryllium, germanium and carbon. In some embodiments, the injection layer may become unintentionally doped with magnesium, e.g., due to diffusion effects from the p-doped layers. In such embodiments, the level of magnesium is too low to cause p-type conductivity in the AlN or AlGaN tunnel injector layer.

In a further embodiment, the semiconductor-based ultraviolet light emitting diode structure further comprises one or more n-doped semiconductor layers. The semiconductor-based ultraviolet light emitting diode structure can further comprise one or more electron barrier layers.

In another embodiment, the invention includes a semiconductor-based ultraviolet light emitting diode device comprising a substrate, and one or more of the semiconductor-based ultraviolet light emitting diode embodiments described above.

In one embodiment, the semiconductor-based ultraviolet light emitting diode structure has layers stacked on a substrate in the following order above the substrate a n-doped semiconductor layer, a light emitting active region, an AlN or AlGaN injection layer with high aluminum content between the light emitting active region and the p-doped layer, wherein said injection layer has a thickness such that holes can tunnel from the p-side of the semiconductor-based ultraviolet light emitting diode structure through the injection layer in the active zone and also reducing leakage electrons out of the active zone, an electron barrier layer; and one or more p-doped layers.

In another embodiment, the invention includes a semiconductor-based ultraviolet light emitting diode device comprising a substrate, and a semiconductor-based ultraviolet light emitting diode structure has layers stacked on a substrate in the following order above the substrate a n-doped semiconductor layer, a light emitting active region, an AlN or AlGaN injection layer with high aluminum content between the light emitting active region and the p-doped layer, wherein said injection layer has a thickness such that holes can tunnel from the p-side of the semiconductor-based ultraviolet light emitting diode structure through the injection layer in the active zone and also reducing leakage electrons out of the active zone, an electron barrier layer; and one or more p-doped layers.

In one embodiment, the n-doped semiconductor layer has a thickness between about 100 nm and about 10000 nm.

In one embodiment, the electron barrier layer has a thickness between about 5 nm and about 100 nm.

In certain embodiments, the substrate is sapphire, Si, SiC, AlN, AlGaN, or a combination thereof.

In one embodiment, the invention includes a semiconductor-based ultraviolet light emitting diode device that emits light having a wavelength between about 200 nm and about 300 nm.

In one embodiment, the device has a lifetime of from about 1 hour to about $10^6$ hours.

In another embodiment, the invention includes a method of producing a LED device having increased quantum efficiency in the deep UV (DUV) region and simultaneous reduced parasitic luminescence. The method includes the step of forming a semiconductor-based ultraviolet light emitting diode structure comprising a light emitting active region, one or more p-doped layer, an AlN or AlGaN injection layer with high aluminum content between the light emitting active region and the p-doped layer, wherein said injection layer has a thickness such that holes can tunnel from the p-side of the semiconductor-based ultraviolet light emitting diode structure through the injection layer in the active zone and also reducing leakage electrons out of the active zone. The method can further include the step of incorporating the semiconductor-based ultraviolet light emitting diode structure into a LED device.

In another embodiment, the invention includes a semiconductor-based ultraviolet light emitting device comprising a first semiconductor layer, a second semiconductor layer, an active layer disposed between the first semiconductor layer and the second semiconductor layer, and an injection layer between the active region and a p-doped semiconductor layer, wherein the injection layer is an AlN or AlGaN injection layer with high aluminum content between the light emitting active region and the p-doped layer. In certain embodiments, the injection layer has a thickness such that holes can tunnel from the p-side of the semiconductor-based ultraviolet light emitting diode structure through the injection layer in the active zone and also reducing leakage electrons out of the active zone. The device can further comprise a light generating structure.

It will be apparent to the person skilled in the art that while the invention has been described in some detail for the purposes of clarity and understanding, various modifications and alterations to the embodiments and methods described herein may be made without departing from the scope of the inventive concept disclosed in this specification.

What is claimed is:

1. A semiconductor-based ultraviolet light emitting diode structure without an Mg-doped electron blocking layer comprising:
   a light emitting active region comprising at least one quantum well layer sandwiched between quantum barrier layers;
   a p-doped AlGaN superlattice;
   one or more additional p-doped layers;
   an AlN or AlGaN injection layer with high aluminum mole fraction between the light emitting active region and the p-doped layer, wherein said AlN or AlGaN injection layer has higher aluminum mole fraction than said quantum barrier layers and a bandgap energy larger than that of said quantum barrier layers,
   wherein said AlN or AlGaN injection layer has higher aluminum mole fraction than aluminum mole fraction in each of said one or more additional p-doped layers and an average aluminum mole fraction of said p-doped AlGaN superlattice, and
   wherein said AlN or AlGaN injection layer has Al concentration of more than 60%;
   wherein said injection layer has a thickness such that holes can tunnel from the p-side of the semiconductor-based ultraviolet light emitting diode structure through the injection layer in the active zone and also reducing leakage electrons out of the active zone, wherein said semiconductor-based ultraviolet light emitting diode structure does not have an Mg-doped electron blocking layer.

2. The semiconductor-based ultraviolet light emitting diode structure of claim 1, wherein said light emitting active region comprises AlGaN or InAlGaN quantum barriers, and wherein the aluminum mole fraction of the AlN or AlGaN tunnel injector layer is higher than the aluminum mole fraction of the quantum barriers.

3. The semiconductor-based ultraviolet light emitting diode structure of claim 1, wherein said light emitting active region comprises quantum barriers, wherein one or more of said p-doped layers comprise aluminum, and wherein the aluminum mole fraction of the p-doped layers is lower than aluminum mole fraction of the quantum barriers.

4. The semiconductor-based ultraviolet light emitting diode structure of claim 1, wherein said light emitting active region comprises quantum barriers, wherein one or more of said p-doped layers comprise aluminum, and wherein the aluminum mole fraction of the p-doped layers is equal to or higher than aluminum mole fraction of the quantum barriers.

5. The semiconductor-based ultraviolet light emitting diode structure of claim 1, wherein said thickness of said injection layer is between about 1 nm and about 8 nm.

6. The semiconductor-based ultraviolet light emitting diode structure of claim 1, wherein the active layer has a thickness of about 1 nm to about 1000 nm.

7. The semiconductor-based ultraviolet light emitting diode structure of claim 1, wherein said one or more p-doped layer independently has a thickness of about 10 nm to about 1000 nm.

8. The semiconductor-based ultraviolet light emitting diode structure of claim 1, wherein the active layer is doped with an impurity.

9. The semiconductor-based ultraviolet light emitting diode structure of claim 1, wherein the injection layer is doped with an impurity.

10. The semiconductor-based ultraviolet light emitting diode structure of claim 9, wherein the impurity is present in an amount less than $10^{18}$ cm$^{-3}$.

11. The semiconductor-based ultraviolet light emitting diode structure of claim 9, wherein the injection layer is doped with at least one impurity selected from the group consisting of silicon, oxygen, magnesium, beryllium, germanium and carbon.

12. The semiconductor-based ultraviolet light emitting diode structure of claim 1, further comprising one or more n-doped semiconductor layers.

13. A semiconductor-based ultraviolet light emitting diode device comprising:
    a substrate, and
    the semiconductor-based ultraviolet light emitting diode of claim 1.

14. The semiconductor-based ultraviolet light emitting diode structure of claim 1, wherein said structure has layers stacked on a substrate in the following order above the substrate:
    a n-doped semiconductor layer;
    a light emitting active region;
    an AlN or AlGaN injection layer with high aluminum mole fraction between the light emitting active region and the p-doped layer, wherein said injection layer has a thickness such that holes can tunnel from the p-side of the semiconductor-based ultraviolet light emitting diode structure through the injection layer in the active zone and also reducing leakage electrons out of the active zone;
    an electron barrier layer; and
    one or more p-doped layers.

15. A semiconductor-based ultraviolet light emitting diode device comprising:
    a substrate, and
    the semiconductor-based ultraviolet light emitting diode of claim 14.

16. The semiconductor-based ultraviolet light emitting diode structure of claim 14, wherein said n-doped semiconductor layer has a thickness between about 100 nm and about 10000 nm.

17. The semiconductor-based ultraviolet light emitting diode structure of claim 14, wherein said electron barrier layer has a thickness between about 5 nm and about 100 nm.

18. The semiconductor-based ultraviolet light emitting diode structure of claim 14, wherein said substrate is sapphire, Si, SiC, AlN, AlGaN, or a combination thereof.

19. The semiconductor-based ultraviolet light emitting diode device of claim 15, wherein said device emits light having a wavelength between about 200 nm and about 300 nm.

20. The semiconductor-based ultraviolet light emitting diode device of claim 15, wherein said device has a lifetime of from about 1 hour to about $10^6$ hours.

21. The semiconductor-based ultraviolet light emitting diode device of claim 1, wherein the light emitting active region comprises at least one AlGaN or InAlGaN quantum well layer sandwiched between two or more AlGaN and/or InAlGaN quantum barrier layers.

22. The semiconductor-based ultraviolet light emitting diode device of claim 21, wherein said one or more quantum well layer is between about 0.5 nm and about 20 nm thick.

23. The semiconductor-based ultraviolet light emitting diode device of claim 22, wherein and the thickness of said two or more quantum barrier layers is independently between about 0.5 nm and about 50 nm.

24. A method of producing a LED device having increased quantum efficiency in the deep UV (DUV) region and simultaneous reduced parasitic luminescence comprising:
   forming a semiconductor-based ultraviolet light emitting diode structure comprising:
      a light emitting active region comprising at least one quantum well layer sandwiched between quantum barrier layers,
      a p-doped AlGaN superlattice;
      one or more additional p-doped layers,
      an AlN or AlGaN injection layer with high aluminum mole fraction between the light emitting active region and the p-doped layer, wherein said AlN or AlGaN injection layer has higher aluminum mole fraction than said quantum barrier layers and a bandgap energy larger than that of said quantum barrier layers, wherein said AlN or AlGaN injection layer has higher aluminum mole fraction than aluminum mole fraction in each of said one or more additional p-doped layers and an average aluminum mole fraction of said p-doped AlGaN superlattice, wherein said AlN or AlGaN injection layer has Al concentration of more than 60%; and wherein said injection layer has a thickness such that holes can tunnel from the p-side of the semiconductor-based ultraviolet light emitting diode structure through the injection layer in the active zone and also reducing leakage electrons out of the active zone, wherein said semiconductor-based ultraviolet light emitting diode structure does not have an Mg-doped electron blocking layer, and
   incorporating said semiconductor-based ultraviolet light emitting diode structure into a LED device.

25. A semiconductor-based ultraviolet light emitting device without an Mg-doped electron blocking layer comprising:
   a first semiconductor layer;
   a second semiconductor layer; and
   an active layer disposed between the first semiconductor layer and the second semiconductor layer comprising at least one quantum well layer sandwiched between quantum barrier layers,
   a p-doped AlGaN superlattice, and
   an injection layer between said active region and a p-doped semiconductor layer, wherein said injection layer is an AlN or AlGaN injection layer with high aluminum mole fraction between the light emitting active region and the p-doped layer, wherein said AlN or AlGaN injection layer has higher aluminum mole fraction than said quantum barrier layers and a bandgap energy larger than that of said quantum barrier layers, wherein said AlN or AlGaN injection layer has higher aluminum mole fraction than aluminum mole fraction in each of said one or more additional p-doped layers and an average aluminum mole fraction of said p-doped AlGaN superlattice, wherein said AlN or AlGaN injection layer has Al concentration of more than 60%; and wherein said injection layer has a thickness such that holes can tunnel from the p-side of the semiconductor-based ultraviolet light emitting diode structure through the injection layer in the active zone and also reducing leakage electrons out of the active zone, and
   a light generating structure, wherein said semiconductor-based ultraviolet light emitting diode structure does not have an Mg-doped electron blocking layer.

26. The semiconductor-based ultraviolet light emitting diode structure of claim 1, wherein said semiconductor-based ultraviolet light emitting diode structure emits at a maximum internal quantum efficiency (IQE) at a wavelength of 200 nm to 280 nm.

27. The semiconductor-based ultraviolet light emitting device of claim 25, wherein said semiconductor-based ultraviolet light emitting device emits at a maximum internal quantum efficiency (IQE) at a wavelength of 200 nm to 280 nm.

28. The semiconductor-based ultraviolet light emitting diode structure of claim 1, wherein the p-doped AlGaN superlattice is a stepped superlattice.

* * * * *